(12) United States Patent
Kollberg et al.

(10) Patent No.: US 12,098,462 B2
(45) Date of Patent: Sep. 24, 2024

(54) METHOD FOR PRODUCING A COMPONENT PART OF A CVD REACTOR

(71) Applicant: AIXTRON SE, Herzogenrath (DE)

(72) Inventors: Marcel Kollberg, Würselen (DE); Francisco Ruda Y Witt, Eschweiler (DE)

(73) Assignee: AIXTRON SE, Herzogenrath (DE)

( * ) Notice: Subject to any disclaimer, the term of this patent is extended or adjusted under 35 U.S.C. 154(b) by 465 days.

(21) Appl. No.: 17/309,452

(22) PCT Filed: Nov. 27, 2019

(86) PCT No.: PCT/EP2019/082674
§ 371 (c)(1),
(2) Date: May 27, 2021

(87) PCT Pub. No.: WO2020/109357
PCT Pub. Date: Jun. 4, 2020

(65) Prior Publication Data
US 2022/0033965 A1 Feb. 3, 2022

(30) Foreign Application Priority Data
Nov. 28, 2018 (DE) ................ 10 2018 130 140.5

(51) Int. Cl.
*C23C 16/455* (2006.01)
*B23K 26/364* (2014.01)
(Continued)

(52) U.S. Cl.
CPC ...... *C23C 16/45508* (2013.01); *B23K 26/364* (2015.10); *B23K 26/389* (2015.10);
(Continued)

(58) Field of Classification Search
CPC .......... C23C 16/45508; C23C 16/4408; C23C 16/4558; B23K 26/364; B23K 26/389;
(Continued)

(56) References Cited

U.S. PATENT DOCUMENTS

2001/0003271 A1* 6/2001 Otsuki ............. H01J 37/32477
156/914
2010/0050944 A1* 3/2010 Kato ................ C23C 16/45551
118/730
(Continued)

FOREIGN PATENT DOCUMENTS

DE 102 47 921 A1 4/2004
DE 100 29 110 B4 5/2006
(Continued)

OTHER PUBLICATIONS

Brien, DE-102008055582-A1, Machine Translation, whole document. (Year: 2023).*
(Continued)

*Primary Examiner* — Duy Vu N Deo
*Assistant Examiner* — Christopher Remavege
(74) *Attorney, Agent, or Firm* — Ascenda Law Group, PC

(57) ABSTRACT

A component made of a quartz blank is used as a component part of a CVD reactor. At least one cavity of the component is created by selective laser etching, wherein a fluid flows through the at least one cavity. When in use, the component is heated to temperatures in excess of 500° C., and comes into contact with hydrides of the main groups IV, V or VI and/or with organometallic compounds or halogenides of elements of the main groups II, III or V.

12 Claims, 10 Drawing Sheets

(51) Int. Cl.
*B23K 26/382* (2014.01)
*B23K 26/402* (2014.01)
*B23K 103/00* (2006.01)

(52) U.S. Cl.
CPC ........ *B23K 26/402* (2013.01); *B23K 2103/52* (2018.08); *B23K 2103/54* (2018.08)

(58) Field of Classification Search
CPC .............. B23K 26/402; B23K 2103/52; B23K 2103/54; B23K 26/362; B23K 26/382; B23K 2103/50
See application file for complete search history.

(56) References Cited

U.S. PATENT DOCUMENTS

| | | | | |
|---|---|---|---|---|
| 2011/0294283 | A1* | 12/2011 | Brien | C23C 16/45508 118/725 |
| 2015/0096496 | A1* | 4/2015 | Suda | C23C 16/303 118/730 |

FOREIGN PATENT DOCUMENTS

| | | | | |
|---|---|---|---|---|
| DE | 102008055582 A1 * | 6/2010 | ....... | C23C 16/45508 |
| DE | 10 2010 000 554 A1 | 9/2010 | | |
| DE | 10 2014 104 21810 A1 | 10/2015 | | |
| DE | 20 2017 002 851 U1 | 6/2017 | | |
| DE | 20 2017 005 165 U1 | 10/2017 | | |
| DE | 10 2017 100 725 A1 | 3/2018 | | |
| DE | 10 2018 202 687 A1 | 5/2018 | | |
| DE | 20 2018 003 890 U1 | 9/2018 | | |
| EP | 1990125 A1 * | 11/2008 | ......... | B23K 26/0093 |
| EP | 2762264 A1 * | 8/2014 | ......... | B23K 26/0057 |
| EP | 3 036 061 B1 | 6/2016 | | |
| EP | 3357879 A1 * | 8/2018 | | |

OTHER PUBLICATIONS

Hofman, EP-3357879-A1, Machine Translation, whole document. (Year: 2023).*

International Search Report mailed Jun. 23, 2020, from the ISA/European Patent Office, for International Patent Application No. PCT/EP2019/082674 (filed Nov. 27, 2019), 10 pgs.

Written Opinion mailed Jun. 23, 2020, from the ISA/European Patent Office, for International Patent Application No. PCT/EP2019/082674 (filed Nov. 27, 2019), 13 pgs.

Gottmann; et al., "Selective Laser-induced Etching of 3D Precision Quartz Glass Components for Micro-fluidic Applications—Up-Scaling of Complexity and Speed," Micromachines (2017), 8(110):1-10.

Hiermans; et al., "Selective, Laser-induced Etching of Fused Silica at High Scan-Speeds Using KOH," JLMN—Journal of Laser Micro/Nanoengineering (2014), 9(2):126-131.

International Preliminary Report on Patentability issued May 25, 2021, from The International Bureau of WIPO, for International Patent Application No. PCT/EP2019/082674 (filed Nov. 27, 2019), 25 pgs.

Written Opinion mailed Jun. 23, 2020, from the ISA/European Patent Office, for International Patent Application No. PCT/EP2019/082674 (filed Nov. 27, 2019), English translation, 10 pgs.

* cited by examiner

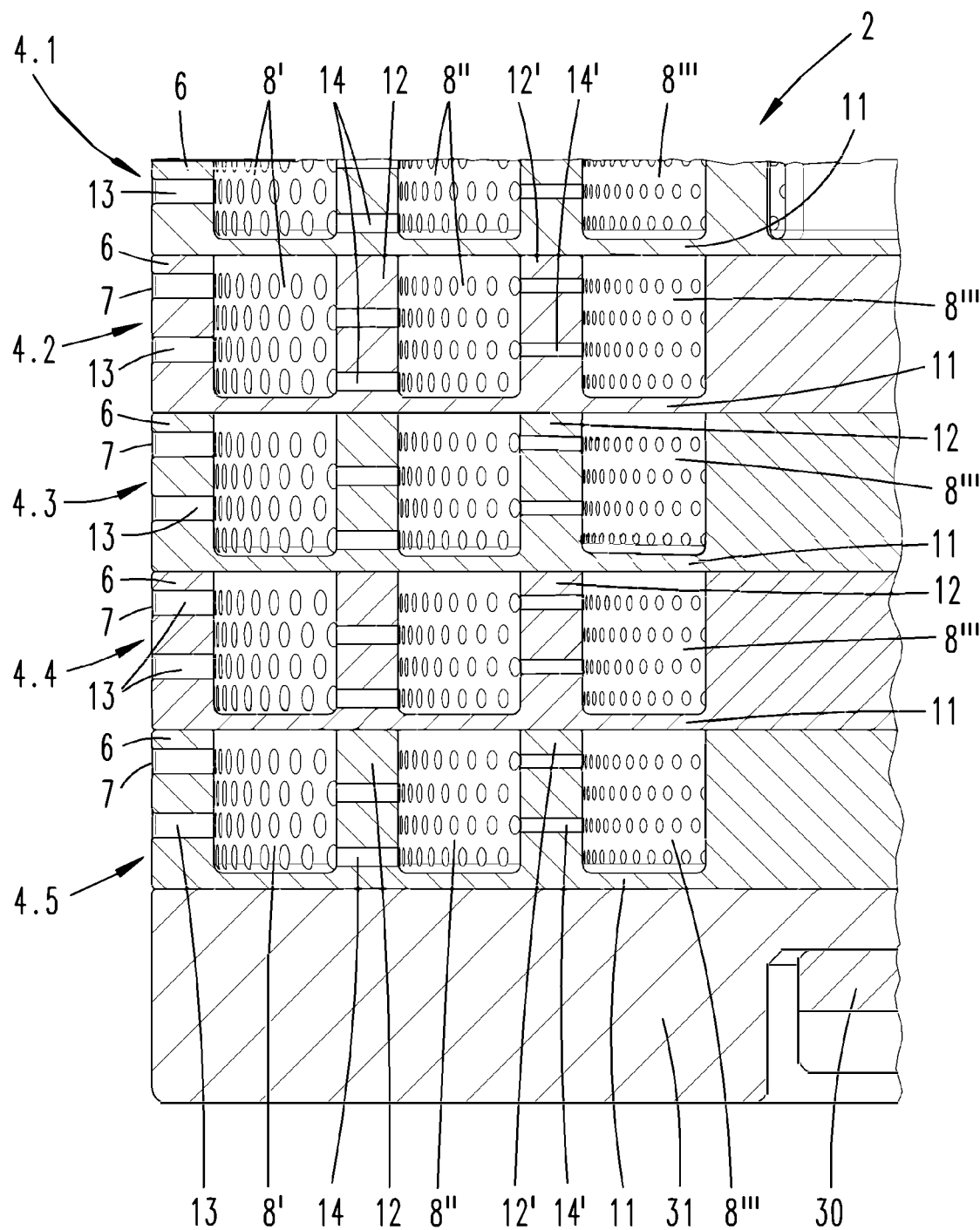

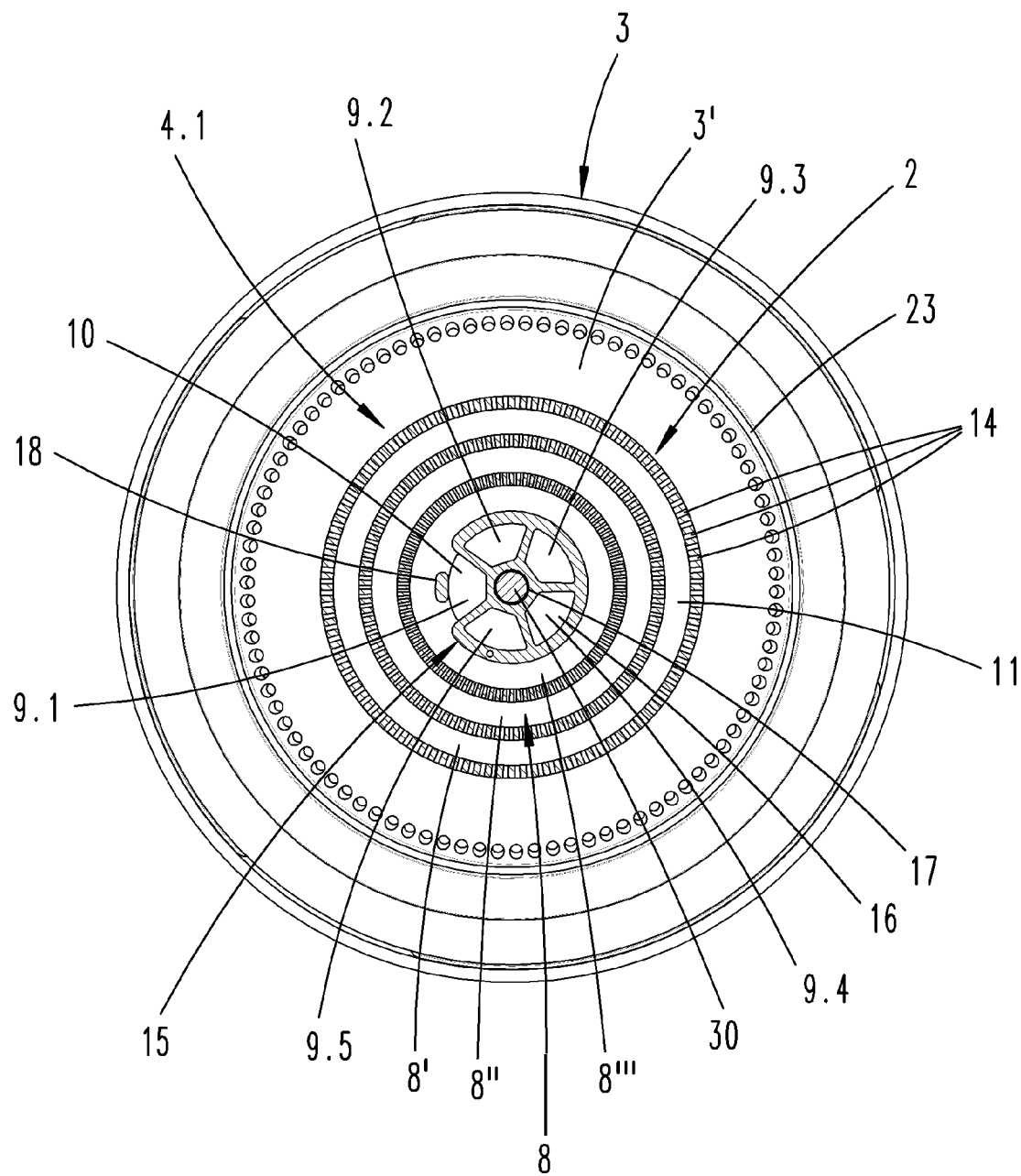

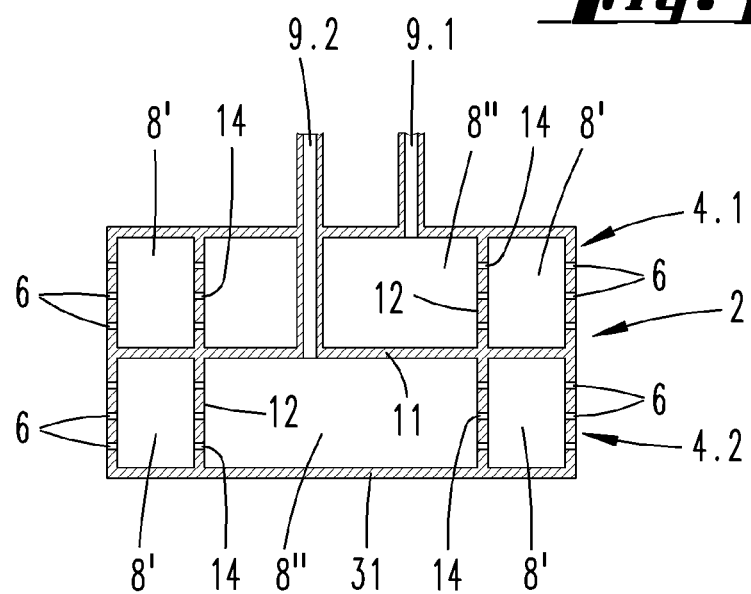
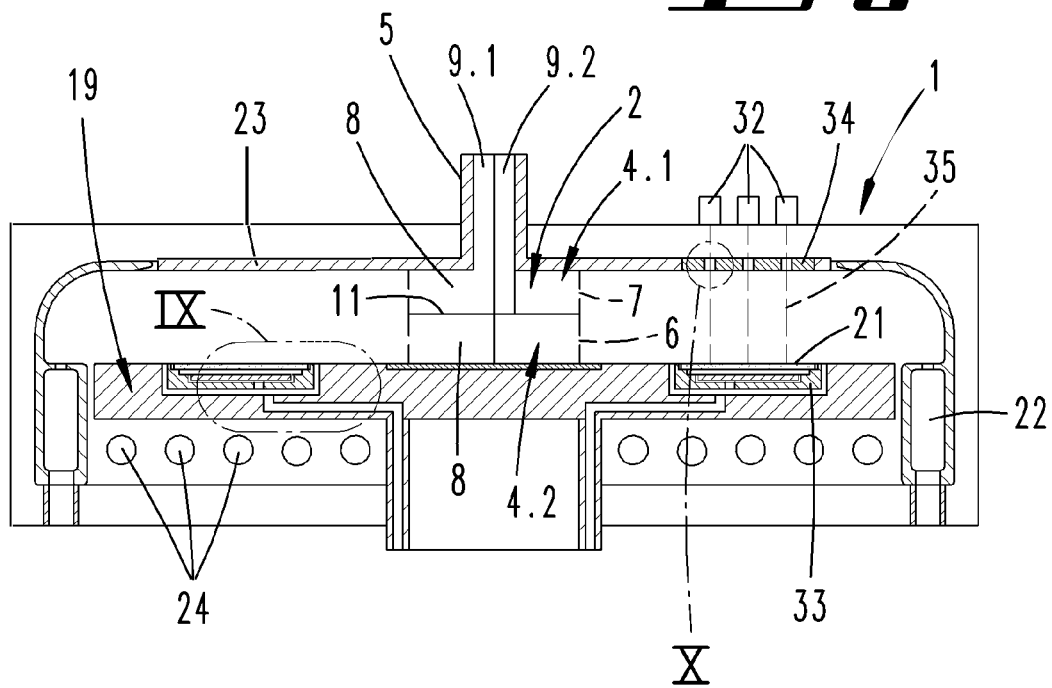

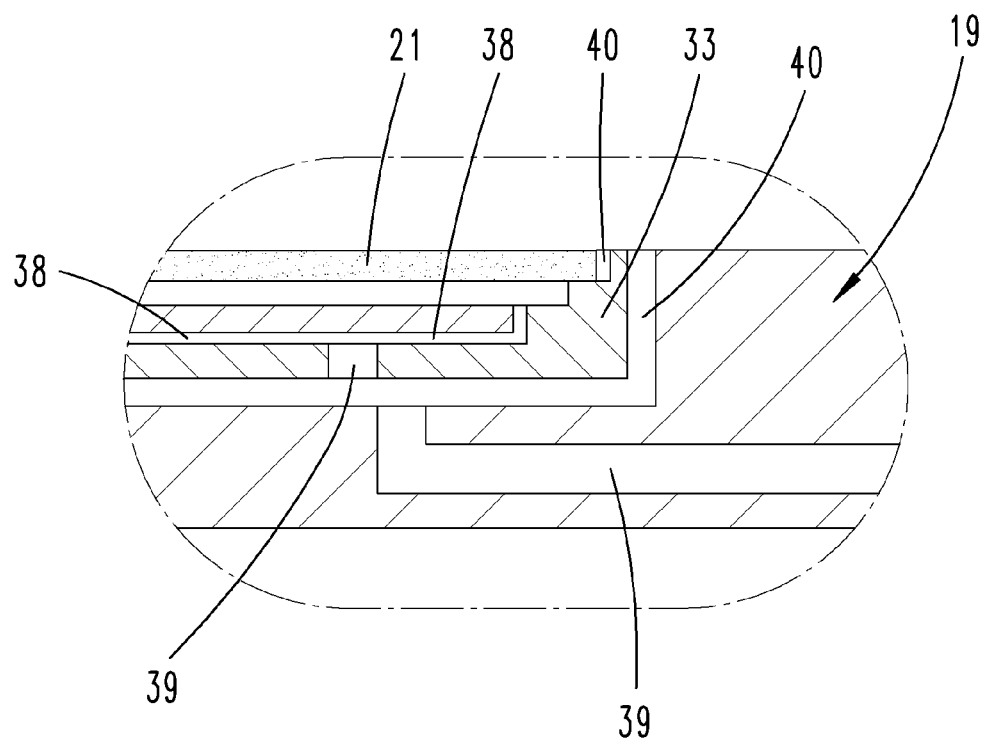
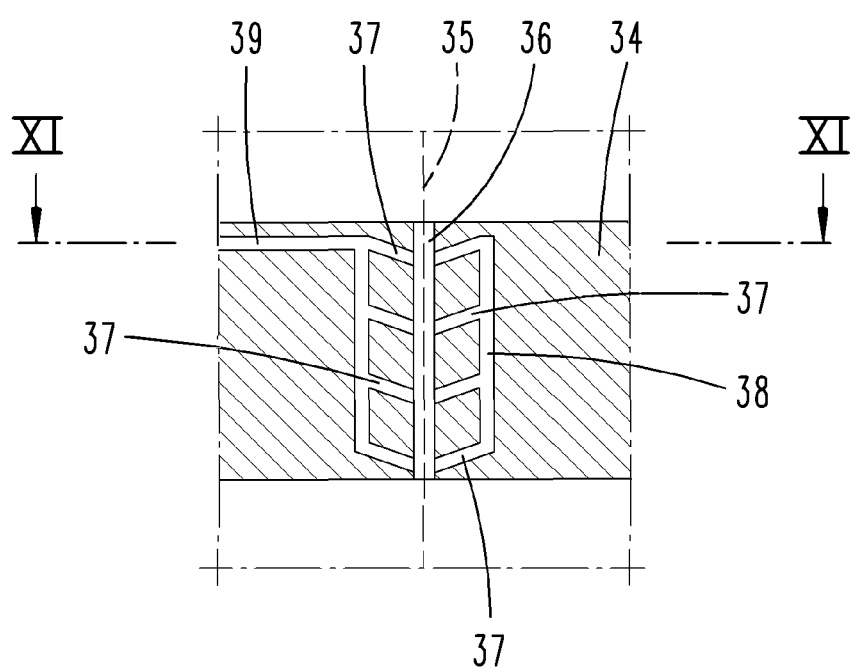

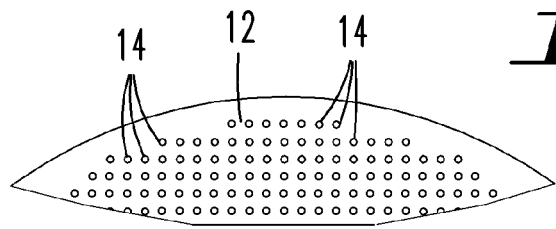
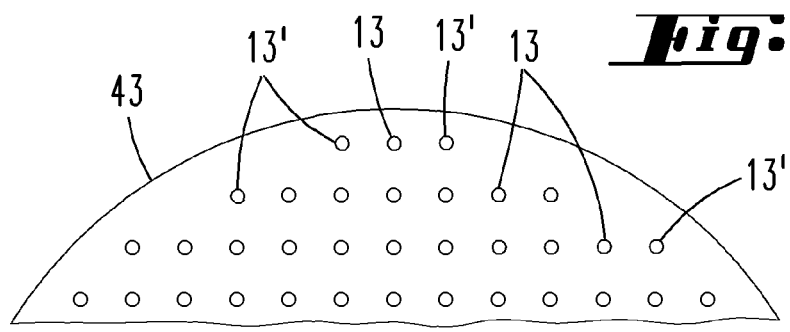
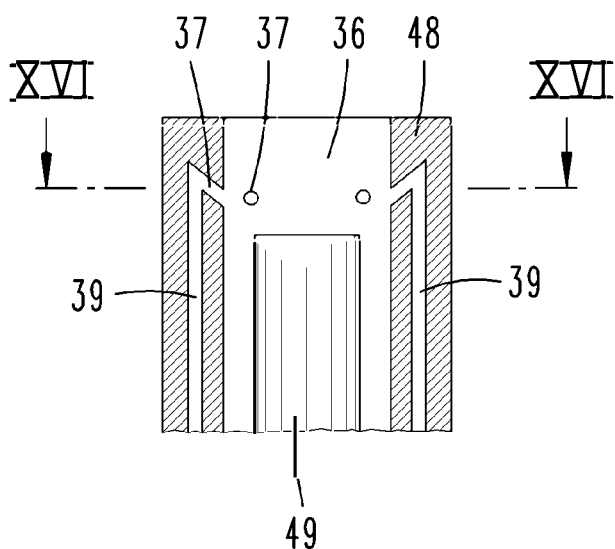
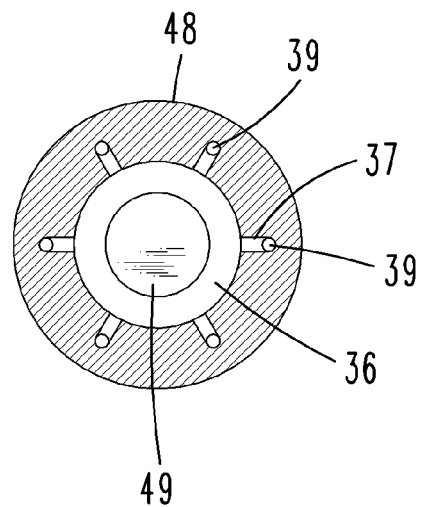

METHOD FOR PRODUCING A COMPONENT PART OF A CVD REACTOR

RELATED APPLICATIONS

This application is a National Stage under 35 USC 371 of and claims priority to International Application No. PCT/EP2019/082674, filed 27 Nov. 2019, which claims the priority benefit of DE Application No. 10 2018 130 140.5, filed 28 Nov. 2018.

FIELD OF THE INVENTION

The invention relates to a method for the manufacture of a component of a CVD reactor, which consists of quartz and has at least one cavity.

The invention relates to a use of a component produced from a quartz blank.

BACKGROUND

A gas inlet unit made of quartz is described in DE 10 2008 055 582 A1. The gas inlet unit there described has a central body, which is arranged around a figure axis of the gas inlet unit. In the central region of the gas inlet unit extend a plurality of gas inlet ducts, arranged concentrically with respect to each other, which open into outlets extending over an entire peripheral length. The outlets of the gas inlet ducts are adjoined by gas distribution chambers surrounding the central section in an annular shape, which are separated by dividing floors into a plurality of gas distribution levels arranged one above another. The radially outer edge of each of the gas distribution chambers is surrounded by a gas distribution wall, which has a multiplicity of gas passage openings, which open into gas outlet openings, through which process gases can be fed into a process chamber of a CVD reactor. Each of the plurality of gas distribution chambers can be fed with an individual gas mixture of a process gas, so that the process gases can flow at levels that differ from each other into a process chamber adjoining the gas inlet unit. In the process chamber, substrates lie on a susceptor heated from underneath, and can be coated with III-V-layers, or with IV-layers, or with II-VI-layers.

Methods for the structuring of quartz bodies are of known art from DE 100 29110 B4, EP 3 036 061 B1, DE 20 2017 002 851 U1 and DE 10 2018 202 687 A1. A quartz blank with a polished surface is first treated with a laser beam. Here the laser beam generates ultra-short pulses and is focused. The focal point is moved in a writing motion, for example line-by-line, through the volume of the quartz blank. At the focal point, the laser beam reaches an intensity above a threshold intensity at which a material transformation takes place in the quartz material. The transformed material can then be removed with a fluid etchant, for example a potassium hydroxide solution. It is known from the prior art to use this method to produce liquid channels for the nozzle bodies of spray heads or spray cans. It is also of known art to produce cavity structures in components for a projection lighting system. It is also known in the art to use this method, known as SLE (selective laser-induced etching), to produce microchannels, shaped holes, and contoured cuts in transparent components made of quartz glass, borosilicate glass, sapphire and ruby.

The prior art also includes the article "Selective, Laser-Induced Etching of Fused Silica at High Scan-Speeds Using KOH, JLMN Journal of Laser Micro/Nanoengineering, Vol. 9, No. 2, 2014, pp. 126-131", as well as DE 102 47 921 A1, DE 10 2010 000 554 A1, DE 10 2014104 218 A1, DE 20 2017 005165 U1 and DE 20 2018 003 890 U1, and the article "Selective Laser-Induced Etching of 3D Precision Quartz Glass Components for Microfluidic Applications—Up-Scaling of Complexity and Speed, Micromachines, Vol. 8(4), 2017, No. 110, pp. 1-10".

SUMMARY OF THE INVENTION

The objective underlying the invention is that of the specification of a method with which, in particular, components of a CVD reactor of complex design can be produced from quartz, as well as the specification of such a quartz component.

The objective is achieved by the invention specified in the claims, wherein the subsidiary claims represent not only advantageous further developments of the invention indicated in the respective independent claims, but also autonomous solutions of the object.

The quartz component of a CVD reactor according to the invention has cavities that are produced by selective laser-induced etching (SLE). In this method, a local material transformation of the initial homogeneous quartz body is carried out in a first process step. For this purpose, an ultra-short pulsed laser beam is focused at a focal point in the micrometer range, wherein the focal point is guided through the volume of the quartz body by a three-dimensional movement of the laser beam relative to the quartz workpiece. First, a solid quartz body is produced, which can have a polished surface. A focused laser beam is used to expose volumetric regions that are distant from the surface. A material transformation of the quartz material takes place at the focal point of the laser beam by way of a multi-photon process. The material thus transformed can be removed in a second process step using an etching fluid. The etching fluid preferably takes the form of a liquid, for example KOH. Inventive components of a CVD reactor are to be produced using this method, which is known in the art per se. For example, the gas distribution wall, its gas passage openings, the central plinth, its gas supply lines, and the flow barrier extending between the central section and the gas distribution wall, including its passage opening, can be produced in a disc-shaped quartz base body with this method. The disc-shaped gas distribution bodies/sections produced in such a materially integral manner can then be stacked one on top of another, and, in particular, joined to one another by means of material bonding. In a particularly preferred variant of the invention, the gas distribution bodies are connected to one another in a materially integral manner. The SLE method described above is also used for the manufacture of such an integral gas inlet unit, produced from a uniform quartz blank. The method according to the invention can be used in particular to produce those components of a CVD reactor that cannot be produced by other shaping processes, for example by casting, blow moulding, or machining. The components produced according to the invention can have complex cavity shapes, and are capable of being used at temperatures above 500° C. in a CVD reactor, wherein they come into contact with hydrides of the IV-, V-, or VI-main group, or with organometallic compounds, or halogens of elements of the II-, III-, or V-main group. The inventive quartz components are, in particular, substrate carriers, gas outlet units, gas inlet units, shield plates, susceptors, light passage plates, sheaths, or cover plates, wherein, in particular, provision is made for these components to have cavity arrangements, which have a multiplicity of gas passage openings, which extend between two surfaces of the component, and are arranged in an essentially uniform manner on a gas outlet surface. Such components serve in particular the purpose of generating a homogeneous gas flow in a process chamber of a CVD reactor, for which purpose the gas outlet openings of a gas outlet surface, that is to say, the free ends of the gas passage holes, are uniformly distributed over a surface. The gas passage holes can have a diameter that is smaller than 0.1 mm. However, provision is also made for the gas passage holes to have a diameter that is smaller than 3 mm, 2 mm, 1 mm, 0.5 mm, or 0.2 mm. Furthermore, provision is preferably made for the component to have a cavity that is formed by at least one large chamber, which forms a gas distribution chamber. The gas distribution chamber branches into a multiplicity of gas passage holes, so that gas outlet openings can communicate with one common gas distribution chamber, or with a plurality of gas distribution chambers. At least one gas supply line opens into the gas distribution chamber. In particular, provision is made for an inner surface of the gas distribution chamber to be designed in a materially integral manner, and to be interrupted only by the outlet of the at least one gas supply line and the openings of the gas passage holes. Provision can thus be made for a gas supply line with a small free flow cross-sectional area to open into a gas distribution chamber that has a large free cross-sectional area, wherein the free cross-sectional area extends at right angles to the direction of flow. The free cross-sectional area of the gas distribution chamber can be at least ten times, preferably twenty times, larger than the free cross-sectional area of the at least one gas supply line, or the sum of the free cross-sectional areas of a plurality of gas supply lines. Provision is furthermore made for the free cross-sectional area of the gas distribution chamber, extending transversely to the flow through the component, to be at least twice, five times, ten times, preferably at least twenty times, at least fifty times, or at least one hundred times, as large as the sum of the free cross-sectional areas of the gas passage holes leading out of the gas distribution chamber. In particular, provision can furthermore be made for the gas passage holes opening into a gas outlet opening to run essentially parallel to each other. If the gas outlet openings lie in a plane, the gas passage holes preferably run mathematically in parallel. If the gas outlet openings lie on a cylindrical peripheral surface, the gas passage holes preferably run in a radial direction. Provision can furthermore be made for the gas outlet holes not to be aligned with one or a plurality of gas supply lines. Provision can furthermore be made for the cavities, in particular gas lines, within the quartz component not to run in a straight line, but to have a plurality of changes of direction. The gas supply lines can have sections running in a straight line, which translate into one another in the form of kink points. However, the gas lines can also extend sinuously through the quartz component, and, in particular, can run on a three-dimensionally sinuous path. In particular, provision is made that processes are carried out in the CVD reactor in which the process temperature is greater than 600, 800, 1,000 or 1,200° C., so that the component can be heated up to these temperatures. In particular, the quartz component can be heated to any temperature that is permissible for the use of quartz components.

BRIEF DESCRIPTION OF THE DRAWINGS

Example embodiments of the invention are explained below with reference to the accompanying drawings. Here:

FIG. 5 shows in an enlarged manner the detail V in FIG. 4, FIG. 6 shows a section along the line VI-VI in FIG. 4, FIG. 7 shows a second example embodiment of a gas inlet unit, FIG. 8 shows a third example embodiment in an illustration as in FIG. 1 with a gas inlet unit 2 configured according to the invention, a susceptor 19 configured according to the invention, a substrate carrier 33 configured according to the invention, a gas outlet 22 configured according to the invention, and with a light passage plate 34 configured according to the invention, FIG. 9 shows in an enlarged manner the detail IX in FIG. 8, FIG. 10 shows in an enlarged manner the detail X in FIG. 8, FIG. 13 shows the section along the line XIII-XIII in FIG. 12, FIG. 14 shows the section along the line XIV-XIV in FIG. 12, FIG. 15 shows a further example embodiment in the form of a sheath for an optical waveguide and FIG. 16 shows the section along the line XVI-XVI in FIG. 15.

DETAILED DESCRIPTION

Figure 1:
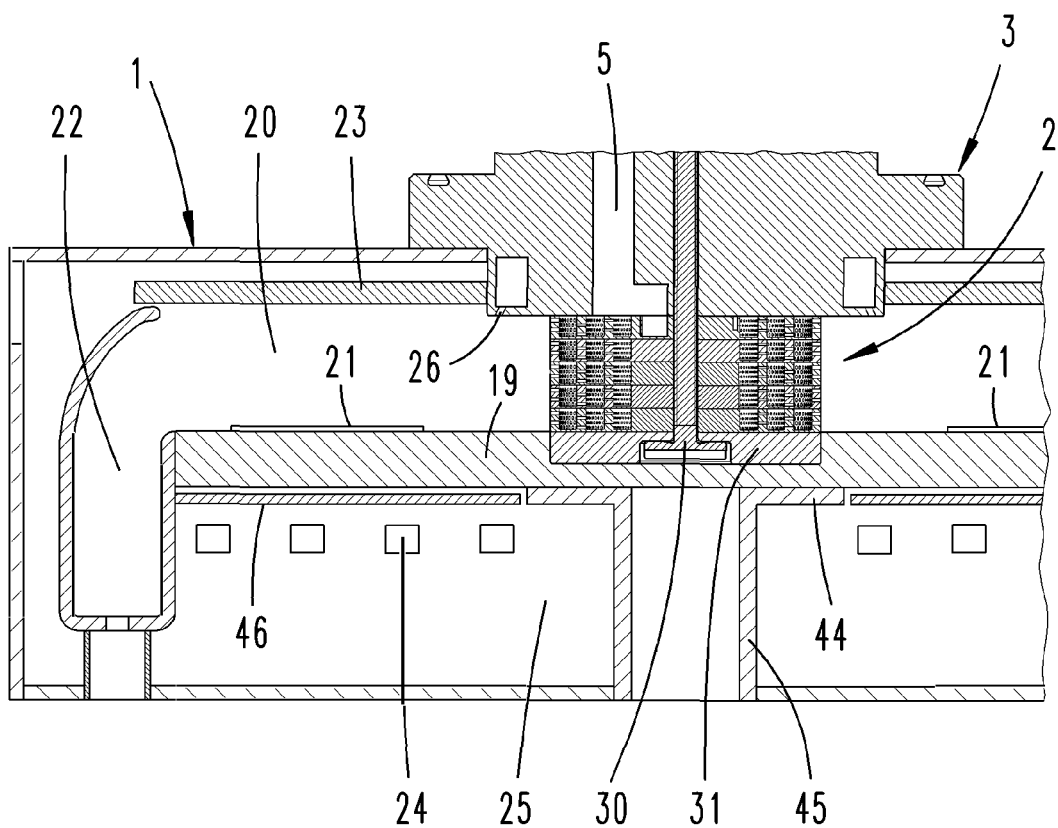
FIG. 1 shows, essentially schematically, in a longitudinal cross-section, the structure of a CVD reactor with a gas inlet unit 2 according to the invention.

FIG. 1 shows, essentially schematically, the structure of a CVD reactor in whose process chamber 20 a CVD deposition process can be carried out, in which a layer, in particular a semiconducting layer, can be deposited on a plurality of substrates 21. The substrates 21 can consist of III-V compounds, of silicon, of sapphire, or of another suitable material. One or a plurality of layers are deposited on the substrate, which can consist of elements of the IV-main group, the III-V main group, or the II-VI main group. Various process gases are introduced into the process chamber 20 through a gas inlet unit 2 by means of a carrier gas, for example $H_2$, or a noble gas, wherein the process gases can contain hydrides of the V-main group, the IV-main group, or organometallic compounds of the IV-main group or the III-main group. A susceptor 19 of coated graphite, or similar, carrying the substrates 21 is brought to a process temperature from underneath by a heating device 24, so that the process gases fed by means of the gas inlet unit into the center of the process chamber 20 pyrolytically decompose on the surfaces of the substrates, arranged in a circle around the center, to form a layer, in particular a single-crystal layer. The process gas, which flows through the process chamber 20 in the radial direction, leaves the process chamber 20 through a gas outlet 22 surrounding the susceptor 19, which gas outlet 22 is connected to a vacuum pump (not shown).

The susceptor 19 is supported on a support plate 44, which consists of quartz. The support plate 44 is supported on a support tube 45, which also consists of quartz. A diffusion barrier 46 produced from quartz extends between the heating device 24 and the susceptor 19.

Inside the reactor housing 1 is located a process chamber ceiling 23, through which an attachment section 3 projects into the process chamber 20. The gas inlet unit 2 is fastened to the attachment section 3, which can be made of metal, in particular stainless steel.

Figure 2:
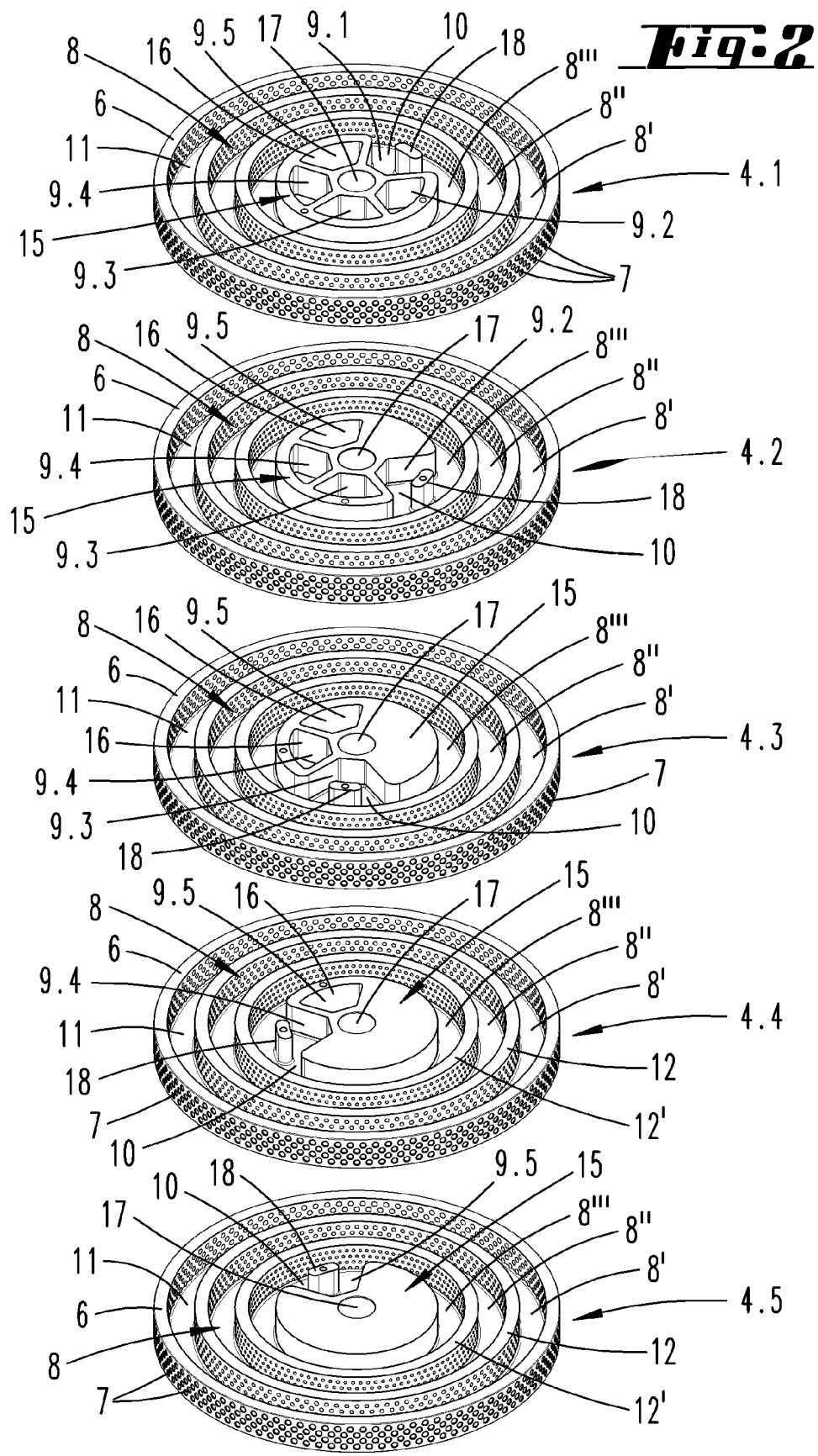
FIG. 2 shows five gas distribution bodies 4.1, 4.2, 4.3, 4.4 and 4.5 arranged one above another to form a gas inlet unit 2.
Figure 3:
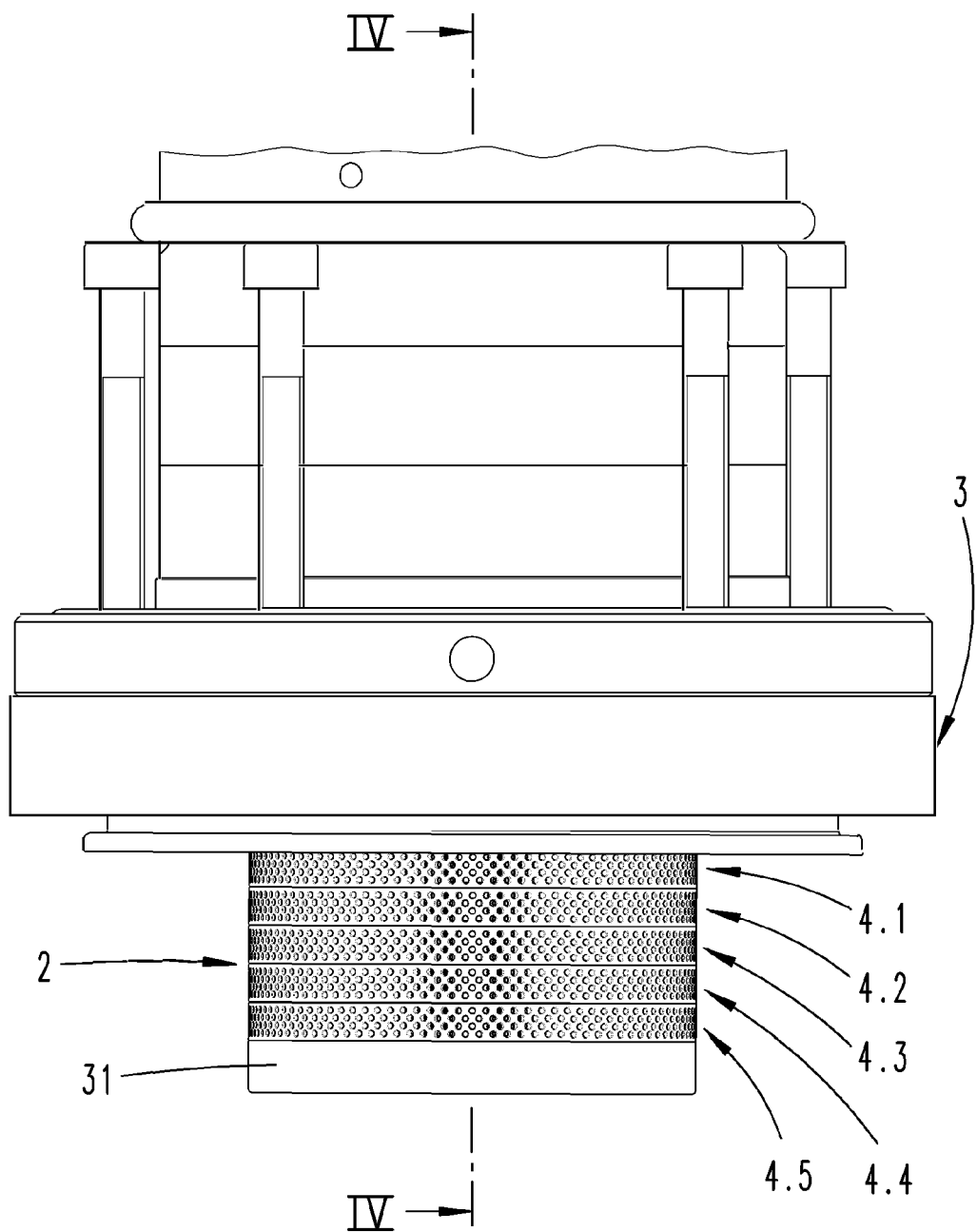
FIG. 3 shows a gas inlet unit in a view.
Figure 4:
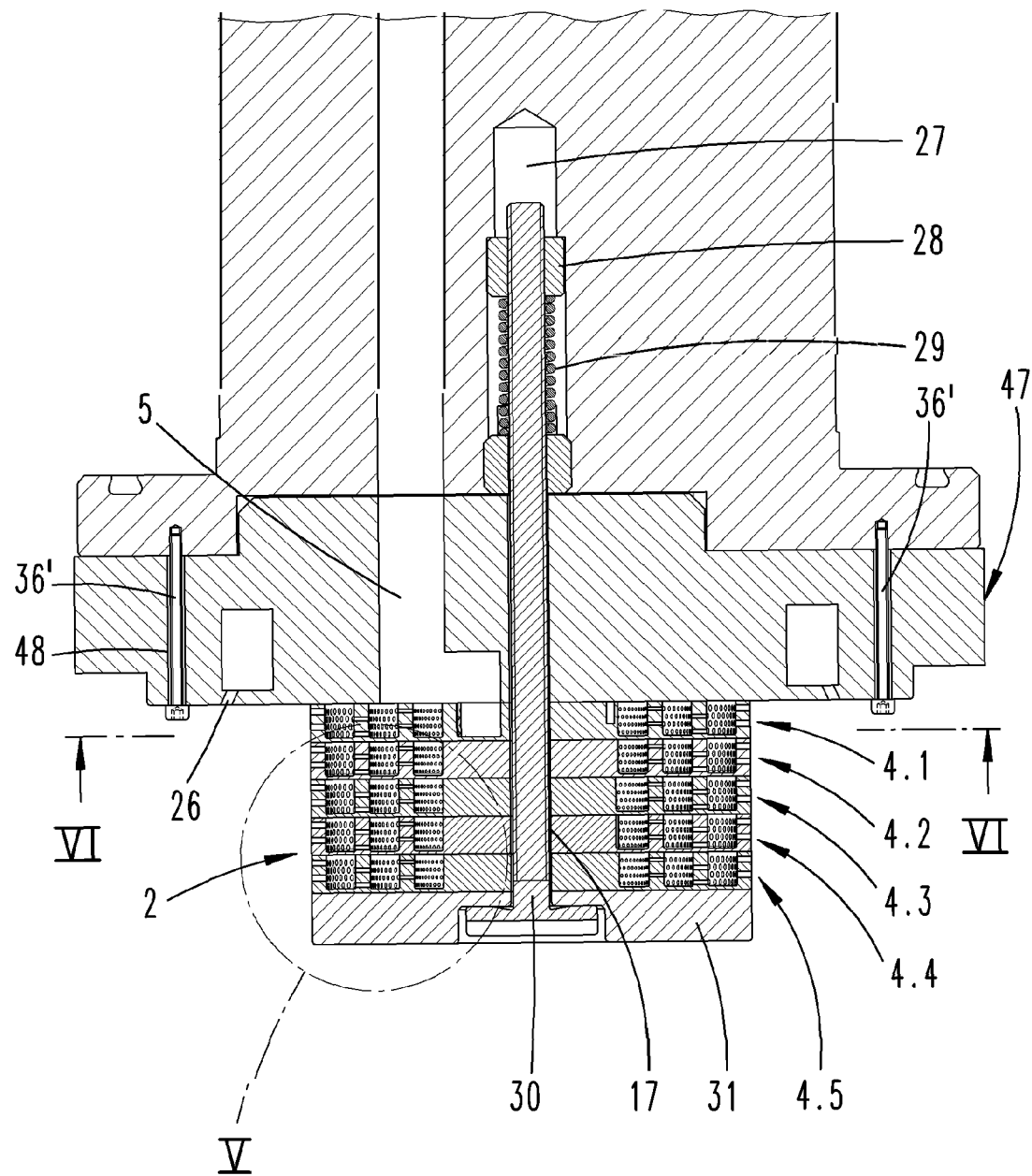
FIG. 4 shows the gas inlet unit illustrated in FIG. 3 in a section along the line IV-IV in FIG. 3.

The gas distribution bodies/sections 4.1, 4.2, 4.3, 4.4 and 4.5 shown in FIG. 2 in each case have a circular disc-shaped base plate, on which a dividing floor 11 is designed, by means of which, gas distribution bodies 4.1, 4.2, 4.3, 4.4 and 4.5 arranged one above another are separated from one another.

A circular gas distribution wall 6 extends from the circular edge of a dividing floor 11, which wall 6 has a multiplicity of uniformly arranged gas passage holes 13. The gas passage holes 13 have a diameter that is smaller than 3 mm, and in particular is smaller than 1 mm. The gas passage holes 13 extending in a radial direction in each case open into a gas outlet opening 7. The height of a gas distribution body 4.1, 4.2, 4.3, 4.4, 4.5 measured in the axial direction of the gas inlet unit 2—with respect to the figure axis—can be between 5 mm and 2 cm. The width of the gas distribution wall 6 extending in the radial direction—with respect to the figure axis—can similarly be in the range between 0.5 cm and 2 cm.

The gas distribution wall 6 surrounds a gas distribution chamber 8, which extends around the central section 15. In an example embodiment, the gas distribution chamber 8 is divided into three annular sections 8', 8" and 8'". A first section 8' of the gas distribution chamber 8 extends from the gas distribution wall 6 to a flow barrier 12, which is arranged concentrically with respect to the gas distribution wall 6. Radially inside the section 8' of the gas distribution chamber 8 surrounded by the flow barrier 12, extends a second flow barrier 12' also running concentrically with respect to the gas distribution wall 6, which flow barrier 12' surrounds a section 8'" of the gas distribution chamber 8, which section 8'" is adjacent to the central section 15. The flow barriers 12, 12' have the same height as the gas distribution wall 6, and in the example embodiment also have the same radial width. The distance between two adjacent flow barriers 12, 12', or between the central section 15 and the flow barrier 12', or between the flow barrier 12 and the gas distribution wall 6, is greater than the wall thickness of the flow barriers 12, 12', or the wall thickness of the gas distribution wall 6. In particular, the radial width of the sections 8', 8", 8'" of the gas distribution chamber 8 is greater than 1 cm.

The annular flow barriers 12, 12' have gas passage holes 14, 14', which are arranged in a uniform peripheral distribution. The diameters of the gas passage holes 14, 14' can have the same diameters as the gas passage holes 13. However, provision is also made for the gas passage holes 14' of an inner flow barrier 12' to have a smaller diameter than the gas passage holes 14 of an outer flow barrier 12, and for the gas passage holes 13 of the gas distribution wall 6 to have a larger diameter than the gas passage holes 14 of the flow barrier 12.

The central section 15 is designed as a plinth, and has the same axial height as the flow barriers 12, 12', or the gas distribution wall 6, so that the tops of the flow barriers 12, 12' and the gas distribution wall 6 lie in the same plane in which a wide surface 15' of the plinth 15 also extends.

Each of the plinths has an outlet 10, with which a gas inlet duct 9.1, 9.2, 9.3, 9.4 and 4.5, associated with the respective gas distribution body 4.1, 4.2, 4.3, 4.4, 4.5, opens into the radially inner section 8'" of the gas distribution chamber 8. The outlets 10 extend from the upper face of the dividing floor 11 to the lower face of the dividing floor 11 of an upper gas distribution body.

It is also considered to be advantageous if the individual gas distribution bodies 4.1, 4.2, 4.3, 4.4 and 4.5 can in each case be machined "from the solid" out of a quartz blank. It is also considered to be advantageous if the entire gas inlet unit 2, with the gas distribution bodies 4.1, 4.2, 4.3, 4.4 and 4.5, which are then connected to each other in a materially integral manner, can be machined out of a single blank.

The SLE method mentioned above is preferably used for the manufacture of the gas inlet unit 2, in which a highly focused and ultra-short pulsed laser beam is used to alter the material of volumetric regions of the quartz blank by a form of writing. These volumetric regions are the gas passage holes 13, the gas passage holes 14, the sections 8', 8", 8'" of the gas distribution chamber 8, the gas inlet ducts 9.1, 9.2, 9.3, 9.4, 9.5, their outlets 10, and the attachment opening 17. After the material transformation has taken place, the transformed material is dissolved out of the quartz body by means of an etching liquid.

It is considered to be particularly advantageous if the parts to be assembled can be minimized with this production method.

The second example embodiment shown in FIG. 7 is a gas inlet unit 2 with two gas distribution chambers 8 arranged one above another, wherein the gas distribution chambers 8 are divided by means of a flow barrier 12 into two sections, namely an upstream section 8" and a downstream section 8'. A gas duct 9.1, 9.2 opens into each gas distribution chamber 8. The essentially cylindrical body of the gas inlet unit 2 has gas passage holes 13, 14, 14' on its cylindrical peripheral surface, and thereby forms a gas distribution wall 6. The two gas distribution chambers 8 are separated from each other by means of a dividing floor 11. A base plate 31 forms the floor of the lower gas distribution chamber 8.

The gas inlet unit 2 consists of a one-piece quartz component. The cavities are produced using the SLE process.

In the third embodiment illustrated in FIGS. 8 to 11, a susceptor 19, a gas outlet 22, a substrate support 33, a gas inlet unit 2, and a light passage plate 34 are made of quartz. These components are also produced using the SLE process.

The susceptor 19 has a gas supply line 39, with which a purge gas can be fed into a pocket 40. A substrate carrier 33, which floats on a gas cushion, is supported in the pocket 40. The gas generating the gas cushion is fed in through the supply line 39.

The substrate carrier 33 has a supply line 39 on its lower face, which opens into a gas distribution chamber 38, which in turn has openings that open into a pocket 40' of the substrate carrier 33. The substrate 21 is supported in the pocket 40' of the substrate carrier 33.

In the case of the susceptor 19 and the substrate carrier 33, the distribution chamber 38 and the supply line 39 are produced with the SLE process.

The gas outlet 22 also has cavities. It takes the form of an annular body that surrounds the susceptor 19 and has a plurality of upward facing openings, through which the process gas fed into the process chamber of the CVD reactor can flow into a gas collection chamber, from which the process gas can exit through a gas outlet opening.

A plurality of gas inlet openings arranged on a circular arc line are provided, through which the process gas flows into the annular gas collection chamber. The gas inlet openings have a smaller free cross-sectional area than the gas collection chamber. One or a plurality of gas outlet openings also have in total a smaller free cross-sectional area than the cross-sectional area of the gas collection chamber.

The gas inlet unit 2 can be configured as shown in FIGS. 1 to 6, or as shown in FIG. 7.

The reference numeral 32 designates pyrometers, with which temperatures of the susceptor surface, or the surface of the substrate 21, can be measured. In the process chamber ceiling 23, there is located a light passage plate 34 made of quartz, which has at least one light passage opening 36. In the example of embodiment, three light passage openings 36 are provided, through each of which an optical path passes.

Figure 11:
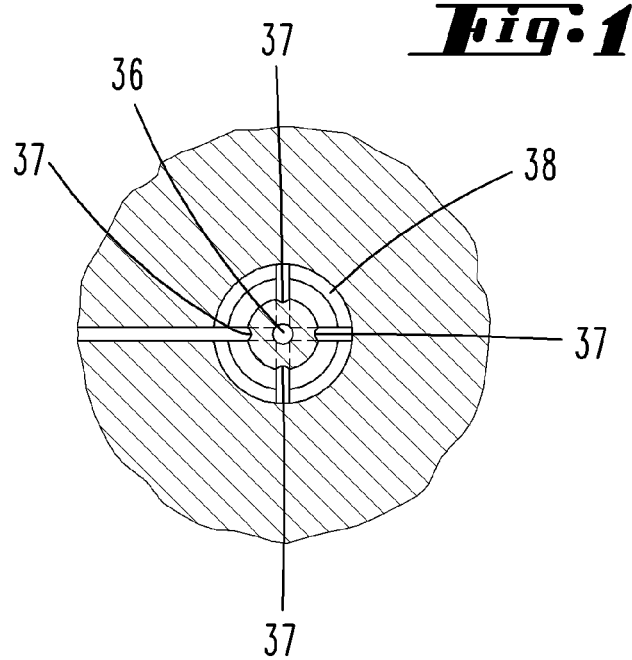
FIG. 11 shows the section along the line XI-XI in FIG. 10.

FIGS. 10 and 11 show the light passage opening 36 in an enlarged manner. The light passage opening 36 is surrounded by a gas distribution chamber 38, from which purging channels 37 extend to the light passage opening 36, so as to purge the light passage opening 36 with a purge gas. The distribution chamber 38 surrounds the light passage opening 36 in a circular annulus. Radially inwardly directed purging channels 37 extend from the distribution chamber 38, wherein the purging channels 37 run obliquely to the direction of the light passage opening 36.

A supply line 39 is provided, through which a purge gas can be fed into the distribution chamber 38.

Figure 12:
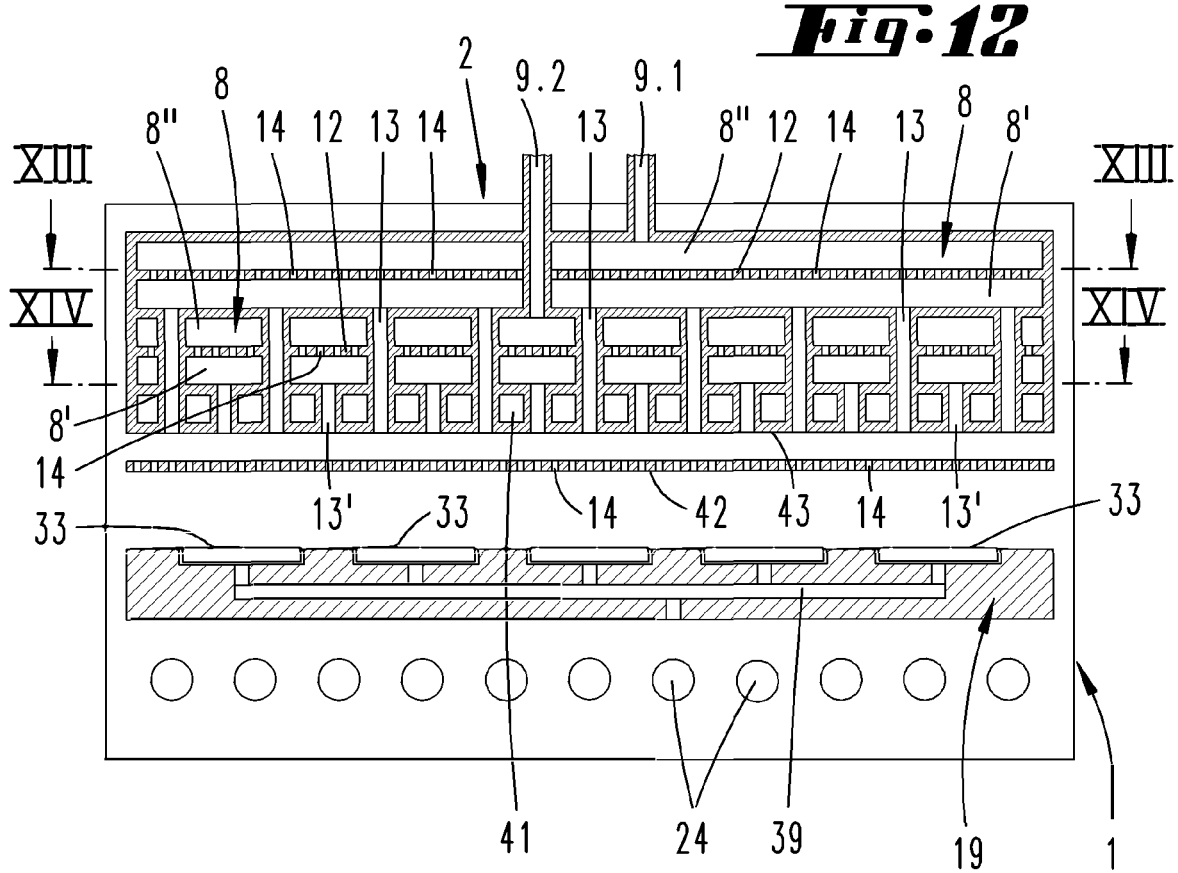
FIG. 12 shows a fourth example embodiment of the invention in an illustration as in FIG. 1, with a gas inlet unit 2 configured according to the invention, a shield plate 42 configured according to the invention, and a susceptor 19 configured according to the invention.

The example embodiment illustrated in FIGS. 12 to 14 shows a CVD reactor 1 with a showerhead gas inlet unit 2, in which two different process gases can respectively be fed through two gas inlet ducts 9.1, 9.2 into a respective gas distribution chamber 8. The two gas distribution chambers 8 lie vertically one above another, and in each case have gas passage holes 13, 13', which end in a gas outlet surface of the gas inlet unit 2. Within each gas distribution chamber 8 there is located a flow barrier 12, 12' with gas passage holes 14, wherein the flow barriers 12, 12' act as pressure barriers.

Adjacent to the gas outlet surface 43 is a coolant volume 41, through which a coolant can flow, in order to cool the gas inlet unit 2. The gas passage holes 13, 13' pass through the coolant volume 41.

Below the gas outlet surface 43 is arranged a shield plate 42, which also has gas passage holes 13.

Below the shield plate 42 extends a susceptor 19 made of quartz, with pockets, in each of which are inserted substrate carriers 33, which rest on a gas cushion.

As in the previous example embodiments, a heating device 24 is provided to bring the susceptor 19 up to a process temperature.

FIGS. 15 and 16 show a sheath 48 for an optical waveguide 49. The optical waveguide 49 is inserted in a central cavity 36. Gas passage holes 37 open into the cavity 36, which holes connect to gas supply lines 39 with the formation of an acute angle, which lines run parallel to the inner wall of the cavity 36 in the axial direction of the cavity 36. A plurality of peripherally evenly distributed arrangements of cavities 37, 39 are provided, which form purge lines for purposes of feeding a purge gas into the cavity 36.

The quartz components described above (gas passage plate 34, substrate support 33, susceptor 19, gas outlet 22, gas inlet unit 2, support plate 44, support tube 45, diffusion barrier 46, sheath 48, and shielding plate 42) can in each case be produced from a quartz blank using the SLE process, wherein it is also envisaged that only individual components of, for example, the gas inlet unit 2 or the susceptor 19 are manufactured using the SLE process, and that the components are bonded to one another with a suitable material bonding agent, for example by means of a borosilicate cement.

The above statements serve to explain the inventions covered by the application as a whole, which inventions in each case also independently further the prior art at least by means of the following combinations of features, wherein two, a plurality, or all, of these combinations of features can also be combined, namely:

A method, which is characterized in that the cavity 8', 8", 8'''; 13, 14, 14'; 9.1, 9.2, 9.3, 9.4, 9.5; 35, 36, 37, 38, 39, 40, 41 is produced by selective laser etching.

A use of a component produced from a quartz blank, in which at least one cavity 8', 8", 8'''; 13, 14, 14'; 9.1, 9.2, 9.3, 9.4, 9.5; 35, 36, 37, 38, 39, 40, 41 has been produced by selective laser etching, as a component of a CVD reactor 1, wherein a fluid flows through the at least one cavity 8', 8", 8'''; 13, 14, 14'; 9.1, 9.2, 9.3, 9.4, 9.5; 35, 36, 37, 38, 39, 40, 41, and the component is heated to temperatures above 500° C. during its use, and comes into contact with hydrides of the IV-, V- or VI-main group, and/or with organometallic compounds or halogen compounds of elements of the II-, III-, or V-main group.

A method or use, which is characterized in that the component is a gas inlet unit 2, a substrate support 33, a gas outlet unit 22, a shield plate 42, a susceptor 19, a light passage plate 34, a support tube 45, a diffusion barrier 46, a support plate 44, a sheath 48, or a cover plate.

A method or use, which is characterized in that the at least one cavity 8', 8", 8'''; 13, 14, 14'; 9.1, 9.2, 9.3, 9.4, 9.5; 35, 36, 37, 38, 39, 40, 41 has a multiplicity of gas passage openings 13, 14, 14', which extend between two surfaces of the component, and are arranged in an essentially uniform manner on a gas outlet surface.

A method or use, which is characterized in that the gas passage hole 13, 14, 14', 37 has a diameter smaller than 3 mm, 2 mm, 1 mm, 0.5 mm, 0.2 mm, or 0.1 mm.

A method or use, which is characterized in that the at least one cavity has a gas distribution chamber 8, 8', 8''', 38, which communicates with the multiplicity of gas passage holes 13, 14, 14', 37.

A method or use, which is characterized in that an inner surface of the gas distribution chamber 8, 8', 8", 38 is closed in a materially integral manner, except for the gas supply lines 9.1, 9.2, 9.3, 9.4, 9.5, 39 leading into it, and the gas passage holes 13, 14, 14', 37 leading out of it.

A method or use, which is characterized in that the free cross-sectional area of the gas distribution chamber 8, 8', 8", 38 extending transversely to the flow through the component is at least ten times, at least twenty times, at least fifty times, or at least one hundred times, as large as the sum of the free cross-sectional areas of the gas supply lines 9.1, 9.2, 9.3, 9.4, 9.5, 39 leading into the gas distribution chamber or of the gas passage holes 13, 14, 14', 37 leading out of it.

A method or use, which is characterized in that the gas supply lines 9.1, 9.2, 9.3, 9.4, 9.5, 39 are not in alignment with the gas passage holes 13, 14, 14', 37.

A method or use, which is characterized in that the at least one cavity is a recess 40, 40' for the accommodation of a substrate 21, or a substrate holder 33.

A method or use, which is characterized in that the at least one cavity is a gas line 38, 39 which does not run in a straight line, or has one or a plurality of points of changes of direction.

A method or use, which is characterized in that in use the component is exposed to temperatures greater than 600, greater than 800, greater than 1,000, or greater than 1,200° C.

All disclosed features are essential to the invention (individually, but also in combination with each other). The disclosure of the application hereby also includes the full disclosure content of the associated/attached priority documents (copy of the previous application), also for the purpose of including features of these documents in the claims of the present application. The subsidiary claims, even without the features of a claim referred to, characterize with their features independent inventive further developments of the prior art, in particular in order to make divisional applications on the basis of these claims. The invention specified in each claim can additionally have one or a plurality of the features specified in the above description, in particular those provided with reference numerals, and/or in the list of reference numerals. The invention also relates to forms of design, in which individual features cited in the above description are not realized, in particular to the extent that they can recognizably be dispensed with for the respective intended use, or can be replaced by other means having the same technical effect.

LIST OF REFERENCE SIGNS

1 CVD reactor
2 Gas inlet unit
3 Attachment section
3' Attachment surface
4.1 Gas distribution body/section
4.2 Gas distribution body/section
4.3 Gas distribution body/section
4.4 Gas distribution body/section
4.5 Gas distribution body/section
5 Gas supply line
6 Gas distribution wall
7 Gas outlet opening
7' Gas outlet opening
8 Gas distribution chamber
8' Downstream section
8" Downstream section
8''' Upstream section
9.1 Gas inlet duct
9.2 Gas inlet duct
9.3 Gas inlet duct
9.4 Gas inlet duct
9.5 Gas inlet duct
10 Outlet
11 Dividing floor
12 Flow barrier
12' Flow barrier
13 Gas passage hole
13' Gas passage hole
14 Gas passage hole
14' Gas passage hole
15 Central section plinth
15' Wide surface
16 Outlet opening
17 Attachment opening
18 Baffle
19 Susceptor
20 Process chamber
21 Substrate
22 Gas outlet, -unit
23 Process chamber ceiling
24 Heating device
25 Recess
26 Gas outlet opening
27 Attachment opening
28 Nut
29 Spring
30 Fixing screw
31 Base plate
32 Pyrometer
33 Substrate carrier, -holder
34 Light passage plate
35 Cavity, optical path
36 Cavity, light passage opening
36' Cavity, light passage opening
37 Cavity, gas passage hole, purging channel
38 Cavity, gas distribution chamber
39 Cavity, gas supply line
40 Cavity, recess, pocket
40' Recess, pocket
41 Cavity, coolant volume
42 Shield plate
43 Gas outlet surface
44 Support plate
45 Support tube
46 Diffusion barrier
47 Flange section
48 Sheath
49 Optical waveguide

What is claimed is:

1. A method for manufacturing a component of a chemical vapor deposition (CVD) reactor (1), which consists of quartz, and has at least one cavity (8', 8", 8"; 13, 14, 14'; 9.1, 9.2, 9.3, 9.4, 9.5; 35, 36, 37, 38, 39, 40, 41), the method comprising etching the at least one cavity (8', 8", 8"; 13, 14, 14'; 9.1, 9.2, 9.3, 9.4, 9.5; 35, 36, 37, 38, 39, 40, 41) by selective laser etching,
    wherein the component is a gas distribution body (4.1-4.5) of a gas inlet unit (2),
    wherein the gas distribution body (4.1-4.5) has a central section (15) formed by a plinth, a gas distribution wall (6) and a gas distribution chamber (8),
    wherein the central section (15) forms an outlet (10) of a gas inlet duct (9.1-9.4) opening into the gas distribution chamber (8) surrounding the central section (15),
    wherein the gas distribution wall (6) surrounds the gas distribution chamber (8) and has a multiplicity of gas passage holes (13, 14, 14'), extending between two surfaces of the gas distribution wall (6), and
    wherein the gas distribution body (4.1-4.5) is machined out of a single quartz blank.

2. The method of claim 1, wherein the gas distribution body (4.1-4.5) has a circular disc-shaped base plate forming a dividing floor (11) by means of which two gas distribution bodies (4.1-4.5) being arranged one above another are separated from another.

3. The method of claim 2, wherein a top surface of the central section (15) and a top surface of the gas distribution wall (6) extend in a first plane.

4. The method of claim 3,
    wherein a flow barrier (12, 12') is located between the gas distribution wall (6) and the central section (15), the flow barrier (12, 12') surrounding the central section (15), and
    wherein a top surface of the flow barrier (12, 12') extends in the first plane.

5. The method of claim 3, wherein an outer surface of the central section (15) forms an inner wall of the gas distribution chamber (8).

6. A gas distribution body (4.1-4.5) of a gas inlet unit (2) machined by etching at least one cavity (8', 8", 8'''; 13, 14, 14'; 9.1, 9.2, 9.3, 9.4, 9.5; 35, 36, 37, 38, 39, 40, 41) of the gas distribution body (4.1-4.5), which consists of quartz, by selective laser etching,
wherein the gas distribution body (4.1-4.5) has a central section (15) formed by a plinth, a gas distribution wall (6) and a gas distribution chamber (8),
wherein the central section (15) forms an outlet (10) of a gas inlet duct (9.1-9.4) opening into the gas distribution chamber (8) surrounding the central section (15),
wherein the gas distribution wall (6) surrounds the gas distribution chamber (8) and has a multiplicity of gas passage holes (13, 14, 14'), extending between two surfaces of the gas distribution wall (6), and
wherein the gas distribution body (4.1-4.5) is machined out of a single quartz blank.

7. The gas distribution body (4.1-4.5) of claim 6, wherein the gas distribution body (4.1-4.5) has a circular disc-shaped base plate forming a dividing floor (11) by means of which two gas distribution bodies (4.1-4.5) being arranged one above another are separated from another.

8. The gas distribution body (4.1-4.5) of claim 7, wherein a top surface of the central section (15) and a top surface of the gas distribution wall (6) extend in a first plane.

9. The gas distribution body (4.1-4.5) of claim 8,
wherein a flow barrier (12, 12') is located between the gas distribution wall (6) and the central section (15), the flow barrier (12, 12') surrounding the central section (15), and
wherein a top surface of the flow barrier (12, 12') extends in the first plane.

10. The gas distribution body (4.1-4.5) of claim 8, wherein an outer surface of the central section (15) forms an inner wall of the gas distribution chamber (8).

11. A gas inlet unit (2) comprising a plurality of gas distribution bodies (4.1-4.5), each of the gas distribution bodies (4.1-4.5) being an instance of the gas distribution body (4.1-4.5) of claim 10, wherein the plurality of gas distribution bodies (4.1-4.5) are stacked one on top of another.

12. The gas inlet unit (2) of claim 11, wherein the plurality of gas distribution bodies (4.1-4.5) are joined to one another by at least one of material bonding or a screw (30).

* * * * *